United States Patent
Yonezawa et al.

(10) Patent No.: US 10,456,974 B2
(45) Date of Patent: Oct. 29, 2019

(54) PHOTOCURABLE COMPOSITION, METHODS FOR PRODUCING FILM, OPTICAL COMPONENT, CIRCUIT BOARD, AND ELECTRONIC COMPONENT BY USING THE SAME, AND CURED PRODUCT

(71) Applicant: CANON KABUSHIKI KAISHA, Tokyo (JP)

(72) Inventors: Shiori Yonezawa, Tokyo (JP); Toshiki Ito, Kawasaki (JP); Keiji Yamashita, Utsunomiya (JP); Keiko Chiba, Utsunomiya (JP); Youji Kawasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 704 days.

(21) Appl. No.: 14/900,593

(22) PCT Filed: Jun. 19, 2014

(86) PCT No.: PCT/JP2014/003313
§ 371 (c)(1),
(2) Date: Dec. 21, 2015

(87) PCT Pub. No.: WO2014/208065
PCT Pub. Date: Dec. 31, 2014

(65) Prior Publication Data
US 2016/0144554 A1  May 26, 2016

(30) Foreign Application Priority Data
Jun. 26, 2013 (JP) .................... 2013-133539
Nov. 29, 2013 (JP) .................... 2013-247134
May 27, 2014 (JP) .................... 2014-109338

(51) Int. Cl.
B29C 59/00    (2006.01)
B29C 59/02    (2006.01)
(Continued)

(52) U.S. Cl.
CPC .......... B29C 59/005 (2013.01); B29C 59/002 (2013.01); B29C 59/022 (2013.01);
(Continued)

(58) Field of Classification Search
CPC .................................................. B29C 59/005
See application file for complete search history.

(56) References Cited

U.S. PATENT DOCUMENTS

2004/0059013 A1    3/2004   Tanabe
2008/0131791 A1    6/2008   Cho et al.
(Continued)

FOREIGN PATENT DOCUMENTS

CN    1208056 A     2/1999
CN    105009256 A   10/2015
(Continued)

OTHER PUBLICATIONS

Youn et al., "Control of Resin Filling and Pattern Quality of Ultraviolet Nanoimprint Lithography in Pentafluoropropane and HeliumAmbient", Journal of Applied Physics 52 (2013) 06GJ07 (Year 2013).
(Continued)

*Primary Examiner* — Larry W Thrower
(74) *Attorney, Agent, or Firm* — Canon U.S.A., Inc. IP Division

(57) ABSTRACT

An imprint method that uses a condensable gas process has a problem in that the surface of a resist cured film is rough. This is resolved by a photocurable composition used for performing imprint in an atmosphere containing a condensable gas. The photocurable composition contains a component (A) which is a (meth)acrylate monomer, a component (B) which is a photopolymerization initiator, and a component (C) which is a mold releasing agent. A saturated solubility of the component (C) in the condensable gas at 5
(Continued)

degrees (Celsius) and 1 atm is 5% by weight or less, the condensable gas being in a liquid state at 5 degrees (Celsius) and 1 atm.

5 Claims, 2 Drawing Sheets

(51) Int. Cl.
| | |
|---|---|
| *C08L 33/08* | (2006.01) |
| *G03F 7/00* | (2006.01) |
| *B29K 33/00* | (2006.01) |
| *B29K 105/00* | (2006.01) |

(52) U.S. Cl.
CPC ............ *B29C 59/026* (2013.01); *C08L 33/08* (2013.01); *G03F 7/0002* (2013.01); *B29C 2059/023* (2013.01); *B29K 2033/08* (2013.01); *B29K 2105/0005* (2013.01)

(56) References Cited

U.S. PATENT DOCUMENTS

| | | |
|---|---|---|
| 2009/0115110 A1 | 5/2009 | Schumaker |
| 2010/0123886 A1 | 5/2010 | Bijnen et al. |
| 2012/0199997 A1 | 8/2012 | Tanabe |
| 2012/0306122 A1 | 12/2012 | Hoshino |
| 2013/0032971 A1 | 2/2013 | Omatsu et al. |
| 2013/0052431 A1 | 2/2013 | Enomoto |
| 2013/0099423 A1 | 4/2013 | Umekawa |
| 2014/0239529 A1 | 8/2014 | Tan et al. |
| 2014/0349086 A1* | 11/2014 | Ito .............................. C08F 2/24 428/195.1 |

FOREIGN PATENT DOCUMENTS

| | | | |
|---|---|---|---|
| JP | H01229024 | A | 9/1989 |
| JP | 3700001 | B2 | 9/2005 |
| JP | 2007-144995 | A | 6/2007 |
| JP | 2011-96766 | A | 5/2011 |
| JP | 2011-171364 | A | 9/2011 |
| JP | 2012-109551 | A | 6/2012 |
| JP | 2012-164785 | A | 8/2012 |
| JP | 2013-70033 | A | 4/2013 |
| JP | 2013168645 | A | 8/2013 |
| JP | 2014033082 | A | 2/2014 |
| KR | 10-2009-0027169 | A | 3/2009 |
| KR | 10-2012-0034105 | A | 4/2012 |
| WO | 2013/008940 | A1 | 1/2013 |
| WO | 2013035761 | A1 | 3/2013 |
| WO | 2013/069511 | A1 | 5/2013 |
| WO | WO-2013069511 | A1 * | 5/2013 ................ C08F 2/24 |
| WO | 2014/046304 | A1 | 3/2014 |
| WO | 2014/084395 | A1 | 6/2014 |

OTHER PUBLICATIONS

Hiroshi Hiroshima, "Quick Cavity Filing in UV Nanoimprint Using Pentafluoropropane", Japanese Journal of Applied Physics, 2008, pp. 5151-5155, vol. 47, No. 6.

Shu Kaneko, et al., "Morphological Changes in Ultraviolet-Nanoimprinted Resin Patterns Caused by Ultraviolet-Curable Resins Absorbing Pentafluoropropane", Japanese Journal of Applied Physics, vol. 51, 2012, pp. 06FJ05 1-6.

Qing Wang, et al., "Effects of Environmental Gas in UV Nanoimprint on the Characteristics of UV-Curable Resin", Japanese Journal of Applied Physics, vol. 49, 2010, pp. 06GL04 1-4.

U.S. Appl. No. 14/900,116, filed Dec. 18, 2015, Takeshi Honma.
U.S. Appl. No. 14/900,126, filed Dec. 18, 2015, Toshiki Ito.

* cited by examiner

[Fig. 1A]
[Fig. 1B]
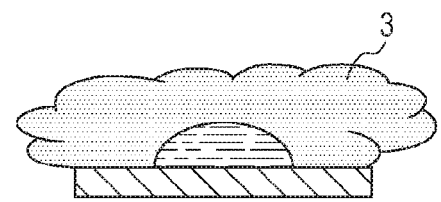
[Fig. 1C-1]
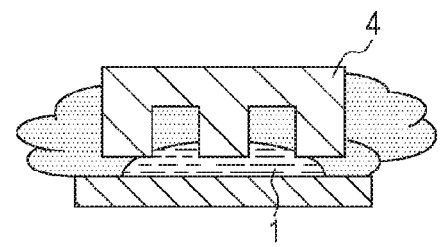
[Fig. 1C-2]
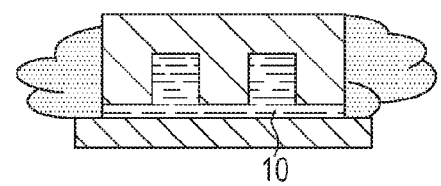
[Fig. 1D]
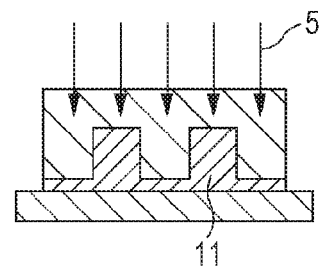
[Fig. 1E]
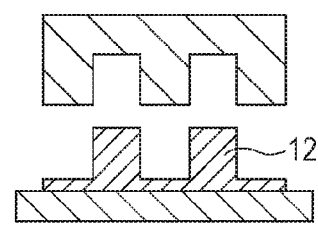

[Fig. 1F]
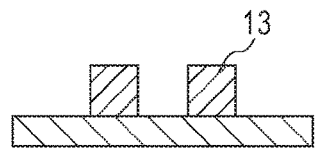
[Fig. 1G]
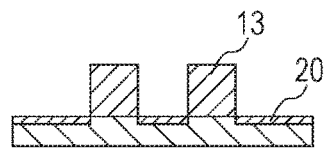
[Fig. 2A]
[Fig. 2B]
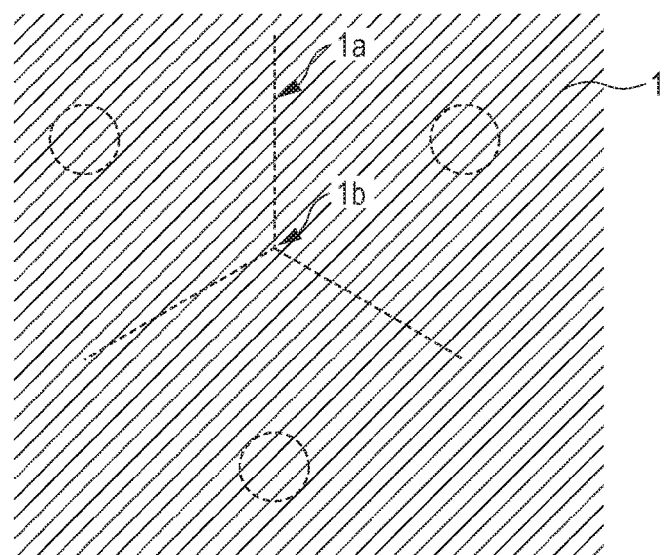

PHOTOCURABLE COMPOSITION, METHODS FOR PRODUCING FILM, OPTICAL COMPONENT, CIRCUIT BOARD, AND ELECTRONIC COMPONENT BY USING THE SAME, AND CURED PRODUCT

TECHNICAL FIELD

The preset invention relates to a photocurable composition, methods for producing a film, an optical component, a circuit board, and an electronic component by using the photocurable composition, and a cured product.

BACKGROUND ART

With the trend toward further size-reduction in the fields of semiconductors, micro electro mechanical systems (MEMS), etc., a technology in which an existing photolithographic technique is combined with a fine processing technique of shaping a resist (photocurable composition) on a substrate (wafer) by using a mold so as to form a resist pattern on the substrate has drawn much attention. This technology is also called a photo imprint technology and can be used to form sub-ten-nanometer order fine structures on a substrate. In a photo imprint system, a resist is first applied to a pattern-forming region of a substrate and then this resist is shaped by using a mold on which a pattern has been formed. Then light is applied to cure the resist and the mold is separated. As a result, a resin pattern (photocured product) remains on the substrate.

When forming the resin pattern (photocured product), the thickness of a residual film of the resin pattern (photocured product) is desirably uniform across the surface of the substrate. This is to suppress in-plane line-width variation that occurs, for example, as a result of dry etching in an etching step, which is a step in the semiconductor device production process other than the pattern-forming step in which the imprint system is used. PTL 1 discloses an imprint method that, in applying a resist onto a substrate by an ink jet method, optimizes the arrangement of resist droplets according to the density of a pattern to be transferred. However, according to this imprint method in which the resist is arranged on a substrate in a discrete manner, the resist does not easily spread on the substrate and thus at the time of pressing a pattern portion of a mold against the resist on the substrate, bubbles tend to remain between the pattern portion and the resist. If the resist is cured with bubbles remaining therein, the resulting resin pattern (photocured product) may come to have an unintended shape. However, productivity would be impaired if one were to wait until the remaining bubbles disappeared.

PTL 2 discloses a method of introducing a condensable gas, which becomes condensed under capillary pressure generated as the resist penetrates the gap between the substrate and the mold and recesses on the mold, between a mold and a substrate so that the gas condenses and undergoes volume reduction after introduction of the gas and that bubbles disappear more rapidly. The condensable gas used in PTL 2 is trichlorofluoromethane ($CFCl_3$). NPL 1 describes that the filling property is improved by using 1,1,1,3,3-pentafluoropropane ($CHF_2CH_2CF_3$) as the condensable gas.

However, these processes that use a condensable gas roughen the surface of the resist although the filling time is shortened.

CITATION LIST

Patent Literature

PTL 1: United States Patent Application Publication No. 2009/0115110
PTL 2: Japanese Patent No. 3700001

Non Patent Literature

NPL 1: Japanese Journal of Applied Physics, Vol. 47, No. 6, 2008, pp. 5151-5155

SUMMARY OF INVENTION

Solution to Problem

An aspect of the present invention provides a photocurable composition used for performing imprint in an atmosphere containing a condensable gas. The photocurable composition contains a component (A) which is a (meth)acrylate monomer, a component (B) which is a photopolymerization initiator, and a component (C) which is a mold releasing agent. A saturated solubility of the component (C) in the condensable gas at 5 degrees (Celsius) and 1 atm is 5% by weight or less, the condensable gas being in a liquid state at 5 degrees (Celsius) and 1 atm.

According to the present invention, a cured film, an optical component, a circuit board and an electronic component that have a small surface roughness can be obtained by performing imprint in an atmosphere containing a condensable gas.

Further features of the present invention will become apparent from the following description of exemplary embodiments with reference to the attached drawings.

BRIEF DESCRIPTION OF DRAWINGS

FIG. 1A is a cross-sectional view of a step in methods for producing a film, an optical component, a circuit board, and an electronic component.

FIG. 1B is a cross-sectional view of another step in the methods for producing a film, an optical component, a circuit board, and an electronic component.

FIG. 1C-1 is a cross-sectional view of another step in the methods for producing a film, an optical component, a circuit board, and an electronic component.

FIG. 1C-2 is a cross-sectional view of another step in the methods for producing a film, an optical component, a circuit board, and an electronic component.

FIG. 1D is a cross-sectional view of another step in the methods for producing a film, an optical component, a circuit board, and an electronic component.

FIG. 1E is a cross-sectional view of another step in the methods for producing a film, an optical component, a circuit board, and an electronic component.

FIG. 1F is a cross-sectional view of another step in the methods for producing a film, an optical component, a circuit board, and an electronic component.

FIG. 1G is a cross-sectional view of another step in the methods for producing a film, an optical component, a circuit board, and an electronic component.

FIG. 2A is a plan view of a photocurable composition of an embodiment placed on portions spaced from one another.

FIG. 2B is another plan view of the photocurable composition placed on portions spaced from one another.

DESCRIPTION OF EMBODIMENTS

Embodiments of the present invention will now be described in detail. These embodiments do not limit the scope of the present invention and may be subject to modification, alterations, etc., based on common knowledge of persons skilled in the art without departing from the essence of the present invention.

A photocurable composition according to one embodiment is a photocurable composition for performing imprint in an atmosphere containing a condensable gas and contains at least a component (A), a component (B), and a component (C) below:

(A) (meth)acryl monomer
(B) photopolymerization initiator
(C) mold releasing agent A saturated solubility of the component (C) in the condensable gas at 5 degrees (Celsius) and 1 atm is 5% by weight or less, the condensable gas being in a liquid state at 5 degrees (Celsius) and 1 atm.

Each component will now be described.

<Component (A): Polymerizable Compound>

The component (A) is a (meth)acryl monomer.

The component (A) which is a (meth)acryl monomer reacts with a polymerization factor (radical or the like) generated from the photopolymerization initiator (component (B)) and forms a polymer compound film as a result of chain reaction (polymerization reaction).

The component (A) may be constituted by one (meth)acryl monomer or two or more (meth)acryl monomers as long as it is constituted by (meth)acryl monomers. When two or more (meth)acryl monomers are used as the component (A), a monofunctional (meth)acryl monomer and a polyfunctional (meth)acryl monomer may be used. This is because a cured film having high strength can be obtained by combining a monofunctional (meth)acryl monomer and a polyfunctional (meth)acryl monomer.

A "(meth)acryl monomer" is a compound (monomer) that contains at least one acryloyl group or methacryloyl group.

A (meth)acryl monomer in which the condensable gas exhibits a saturated solubility of 30% by weight or less at about room temperature. i.e., 23 degrees (Celsius), may be used as the component (A). The saturated solubility of the condensable gas discussed here is the solubility in terms of percentage obtained by bubbling the condensable gas for 15 minutes at a condensable gas flow rate of 0.1 L/min at 23 degrees (Celsius) and 1 atm in 3 g of a subject solution in which the condensable gas is to be dissolved, and dividing the increase in weight observed thereby by the weight (3 g) of the subject solution before bubbling and dissolution of the condensable gas.

In the case where only one (meth)acryl monomer is used as the component (A), that (meth)acryl monomer may be one in which the condensable gas exhibits a saturated solubility of 30% by weight or less at 23 degrees (Celsius).

In the case where two or more (meth)acryl monomers are used in combination as the component (A), the choice of (meth)acryl monomers may be made so that the saturated solubility of the condensable gas in the mixture of these monomers is 30% by weight or less at 23 degrees (Celsius).

Specific examples of the component (A) include, but are not limited to, isobornyl (meth)acrylate, dicyclopentenyl (meth)acrylate, dicyclopentanyl (meth)acrylate, dicyclopentenyloxyethyl (meth)acrylate, pentamethylpiperidinyl methacrylate, tetramethylpiperidinyl methacrylate, tetrahydrofurfuryl (meth)acrylate, benzyl (meth)acrylate, phenoxyethyl (meth)acrylate, phenoxypolyethylene glycol acrylate, nvinylpyrrolidone, 1-adamantyl (meth)acrylate, 2-methyl-2-adamantyl (meth)acrylate, 2-ethyl-2-adamantyl (meth)acrylate, 3-hydroxy-1-adamantyl (meth)acrylate, dimethylol tricyclodecane di(meth)acrylate, 1,3-adamantane dimethanol di(meth)acrylate, 1,3-adamantane diol di(meth)acrylate, decalin dimethanol di(meth)acrylate, 1,9-nonanediol (meth)acrylate, 1,10-decanediol acrylate, dodecyl (meth)acrylate, isododecyl (meth)acrylate, octadecyl (meth)acrylate, isooctadecyl (meth)acrylate, 2-hydroxyethyl (meth)acrylate, and any combination of these.

The examples of the component (A) above are particularly preferable when the condensable gas is 1,1,1,3,3-pentafluoropropane ($CHF_2CH_2CF_3$, may also be described as HFC-245fa and may be referred to as PFP hereinafter). This is because these compounds are (meth)acryl monomers in which the saturated solubility of 1,1,1,3,3-pentafluoropropane at 23 degrees (Celsius) is low. Moreover, when the condensable gas is 1,1,1,3,3-pentafluoropropane, a mixture of isobornyl acrylate and 1,10-decanediol diacrylate is most preferable as the component (A) among these examples.

Other specific examples of the component (A) include monofunctional (meth)acryl compounds having one acryloyl group or methacryloyl group, such as phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, a (meth)acrylate of EO-modified p-cumylphenol, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonyl phenyl ether (meth)acrylate, bornyl (meth)acrylate, tricyclodecanyl (meth)acrylate, cyclohexyl (meth)acrylate, 4-butylcyclohexyl (meth)acrylate, acryloylmorpholine, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, lauryl (meth)acrylate, stearyl (meth)acrylate, isostearyl (meth)acrylate, butoxyethyl (meth)acrylate, ethoxy diethylene glycol (meth)acrylate, polyethylene glycol mono(meth)acrylate, polypropylene glycol mono(meth)acrylate, methoxyethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxy methyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of the commercially available products of such monofunctional (meth)acryl compounds include ARONIX M101, M102, M110, M111, M113, M117, M5700, TO-1317, M120, M150, and M156 (products of TOAGOSEI CO., LTD.), MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (products of Osaka Organic Chemical Industry Ltd.), LIGHT ACRYLATE BO-A, EC-A, DMP-A, THF-A, HOP-A, HOA-MPE, HOA-MPL, PO-A, P-200A, NP-4EA, and NP-8EA, and EPOXY ESTER M-600A (products of Kyoeisha Chemical Co., Ltd.). KAYARAD TC110S, R-564, and R-128H (products of NIPPON KAYAKU Co., Ltd.), NK ESTER AMP-10G and AMP-20G (products of Shin-Nakamura Chemical Co., Ltd.), FA-511A, 512A, and 513A (products of Hitachi Chemical Co., Ltd.), PHE, CEA, PHE-2, PHE-4, BR-31, BR-31M, and BR-32 (products of Dai-Ichi Kogyo Seiyaku Co., Ltd.). VP (product of BASF), and ACMO, DMAA, and DMAPAA (products of KOHJIN Holdings Co., Ltd.).

Other specific examples of the component (A) include polyfunctional (meth)acryl compounds having two or more acryloyl groups or methacryloyl groups, such as trimethylolpropane di(meth)acrylate, trimethylolpropane tri(meth)acrylate, EO-modified trimethylolpropane tri(meth)acrylate, PO-modified trimethylolpropane tri(meth)acrylate, EO-, PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl) isocyanurate tri(meth)acrylate, tris(acryloyloxy) isocyanurate, bis (hydroxymethyl) tricyclodecane di(meth)acrylate, dipentaerythritol penta(meth)acrylate, dipentaerythritol hexa(meth)acrylate, EO-modified 2,2-bis(4-((meth)acryloxy) phenyl)propane, PO-modified 2,2-bis(4-((meth)acryloxy) phenyl)propane, and EO-, PO-modified 2,2-bis(4-((meth) acryloxy)phenyl)propane.

Examples of the commercially available products of these polyfunctional (meth)acryl compounds include YUPIMER UV SA1002 and SA2007 (products of Mitsubishi Chemical Corporation), Viscoat #195, #230, #215, #260, #335HP, #295, #300, #360, #700, GPT, and 3PA (products of Osaka Organic Chemical Industry Ltd.), LIGHT ACRYLATE 4EG-A, 9EG-A, NP-A, DCP-A, BP-4EA, BP-4PA, TMP-A. PE-3A. PE-4A, and DPE-6A (products of Kyoeisha Chemical Co., Ltd.), KAYARAD PET-30, TMPTA, R-604, DPHA, DPCA-20, -30, -60, -120, HX-620, D-310, and D-330 (products of NIPPON KAYAKU Co., Ltd.), ARONIX M208, M210, M215, M220, M240, M305, M309, M310, M315, M325, and M400 (products of Toagosei Co., Ltd.), and Ripoxy VR-77, VR-60, and VR-90 (products of Showa Denko Co., Ltd.).

In the compound groups described above, "(meth)acrylate" means an acrylate and a corresponding methacrylate. A "(meth)acryloyl group" refers to an acryloyl group and a corresponding methacryloyl group. EO represents ethylene oxide and an "EO-modified compound" refers to a compound that has a block structure of an ethylene oxide group. PO represents propylene oxide and a "PO-modified compound" refers to a compound having a block structure of a propylene oxide group.

<Component (B): Photopolymerization Initiator>

The component (B) is a photopolymerization initiator.

For the purposes of the present invention and the specification, a photopolymerization initiator is defined as a compound that generates a polymerization factor (radical) upon sensing light of a particular wavelength. More specifically, the component (B) is a compound that generates a radical upon irradiation with light (infrared rays, visible rays, ultraviolet rays, far ultraviolet rays, X-rays, charged particle beams such as electron beams, and radiations).

One photopolymerization initiator or a combination of two or more photopolymerization initiators may be used as the component (B).

The blend ratio of the photopolymerization initiator serving as the component (B) in the photocurable composition is 0.01% by weight or more and 10% by weight or less and preferably 0.1% by weight or more and 7% by weight or less relative to the total amount of the component (A).

Because the blend ratio of the photopolymerization initiator serving as the component (B) is 0.01% by weight or more relative to the total amount of the component (A), the curing rate tends to be high. Because the blend ratio of the photopolymerization initiator is 10% by weight or less, a cured product of a photocurable composition tends to exhibit good mechanical properties.

Examples of the component (B) are photoradical generators. Examples of the photoradical generators include, but are not limited to, substituted or unsubstituted 2,4,5-triaryl imidazole dimers such as a 2-(o-chlorophenyl)-4,5-diphenyl imidazole dimer, a 2-(o-chlorophenyl)-4,5-di(methoxyphenyl) imidazole dimer, a 2-(o-fluorophenyl)-4,5-diphenyl imidazole dimer, and a 2-(o- or p-methoxyphenyl)-4,5-diphenyl imidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1,2-methyl-1-[4-(methyl thio)phenyl]-2-morpholiono-propanone-1-on; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methyl benzoin, ethyl benzoin, and propyl benzoin; benzyl derivatives such as benzyl dimethyl ketal; acridine derivatives such as 9-phenylacridine and 1,7-bis(9,9'-acridinyl)heptane; N-phenyl glycine derivatives such as N-phenyl glycine; acetophenone derivatives such as acetophenone, 3-methylacetophenone, acetophenone benzyl ketal, 1-hydroxycyclohexyl phenyl ketone, and 2,2-dimethoxy-2-phenyl acetophenone; thioxanthone derivatives such as thioxanthone, diethylthioxanthone, 2-isopropylthioxanthone, and 2-chlorothioxanthone; xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, and bis-(2,6-dimethoxybenzoyl)-2,4,4-trimethylpentylphosphine oxide. These may be used alone or in combination.

Examples of commercially available products of photoradical generators include, but are not limited to, Irgacure 184, 369, 651, 500, 819, 907, 784, 2959, CGI-1700, -1750, -1850, and CG24-61, and Darocur 1116 and 1173 (products of Ciba Specialty Chemicals Inc.), Lucirin TPO, LR8893, and LR8970 (products of BASF), and EBECRYL P36 (product of UCB).

The component (B) is preferably an alkyl phenone-based polymerization initiator, an acyl phosphine oxide-based polymerization initiator, or an oxime ester-based polymerization initiator among these examples.

Among the compounds listed above, alkyl phenone-based polymerization initiators are benzoin ether derivatives such as benzoin methyl ether, benzoin ethyl ether, and benzoin phenyl ether, benzoin derivatives such as benzoin, methyl benzoin, ethyl benzoin, and propyl benzoin, benzyl derivatives such as benzyl dimethyl ketal, and acetophenone derivatives such as acetophenone, 3-methylacetophenone, acetophenone benzyl ketal, 1-hydroxycyclohexyl phenyl ketone, and 2,2-dimethoxy-2-phenylacetophenone.

A more specific example of the alkyl phenone-based polymerization initiator is a compound represented by formula (1) below, which is 2-benzyl-2-dimethylamino-1-(4-morpholinophenyl)-butanone-1.

[Chem. 1]

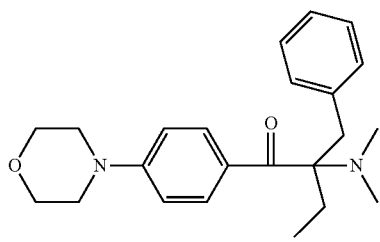

Formula (1)

Among the compounds listed above, acylphosphine oxide-based polymerization initiators are 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide. Among these, 2,4,6-trimethylbenzoyldiphenylphosphine oxide is preferable as the acylphosphine oxide-based polymerization initiator.

2,4,6-Trimethylbenzoyldiphenylphosphine oxide is a compound represented by formula (2) below:

[Chem. 2]

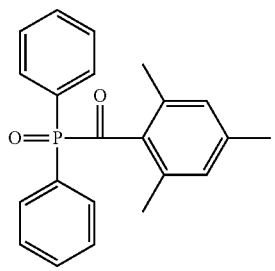

Formula (2)

Among the compounds listed above, oxime ester-based polymerization initiators are 1,2-octanedione, 1-[4-(phenylthio)-,2-(O-benzoyloxime)] and ethanone, 1-[9-ethyl-6-(2-methylbenzoyl)-9H-carbazol-3-yl]-,1-(0-acetyloxime).

The photopolymerization initiators represented by formulae (1) and (2) are preferable since they are highly sensitive polymerization initiators and give a photocurable composition with good curability.

<Component (C): Mold Releasing Agent>

The component (C) is a mold releasing agent.

A mold releasing agent is a compound contained in a photocurable composition that helps decrease mold releasing force of a cured product obtained by curing the photocurable composition. In other words, the force required to separate a mold from a cured product obtained by curing a photocurable composition containing a mold releasing agent is smaller than the force required to separate a mold from a cured product obtained by curing a photocurable composition not containing a mold releasing agent.

The mold releasing agent tends to segregate at the interface between the photocurable composition and the mold. This means that the concentration of component (C) (the mold releasing agent) at the interface between the photocurable composition and the mold tends to be higher than the concentrations in other portions of the photocurable composition.

Examples of the mold releasing agent include a surfactant having a portion having high affinity to the component (A) and a portion having low affinity to the component (A) and a material that has a portion that can readily adsorb onto a mold. A "portion having high affinity to the component (A)" is a portion that is highly miscible with the component (A) and exhibits high polarity by containing a polarization-inducing atom such as an oxygen atom, a nitrogen atom, or a sulfur atom. Examples of such a portion include an oxyethylene group and a repeated structure of an oxyalkylene group. More specific examples thereof include an oxyethylene group, a repeated structure of an oxyethylene group, an oxypropylene group, and a repeated structure of an oxypropylene group.

A "portion having low affinity to the component (A)" is a portion that is sparingly miscible with the component (A) and exhibits low polarity since no atoms that can induce polarization, such as an oxygen atom, a nitrogen atom, and a sulfur atom, are contained. Examples of such a portion include linear hydrocarbon groups.

When the portion having high affinity to the component (A) is constituted by two or more groups, each of the groups may have high affinity to the component (A). When the portion having low affinity to the component (A) is constituted by two or more groups, each of the groups may have low affinity to the component (A). Examples of the portion that can readily adsorb onto a mold composed of quartz are polar functional groups that interact (for example, hydrogen-bond) with the quartz surface. Examples of such a group include a hydroxyl group, a carboxyl group, a sulfo group, an alkoxy group, a pyridyl group, and a silanol group.

The saturated solubility of the component (C) in the condensable gas which is in a liquid state at 5 degrees (Celsius) and 1 atm is 5% by weight or less, preferably 1.0% by weight or less, and more preferably less than 1.0% by weight.

Since the saturated solubility of the component (C) in the condensable gas in a liquid state at 5 degrees (Celsius) and 1 atm is 5% by weight or less, the surface roughness of the resist cured film obtained by an imprint process conducted in a condensable gas atmosphere described below is decreased.

The reason for this is presumably as follows.

According to a method for producing a patterned film described below by using the photocurable composition of this embodiment, the component (C) segregates at the interface between the photocurable composition and the mold in the mold contact step [2]. At this time, the condensable gas is condensed and liquefies by the capillary pressure generated as the photocurable composition contacts the mold and penetrates the gap between the substrate and the mold and the recesses on the mold.

Since the saturated solubility of the component (C) in the condensable gas in a liquid state at 5 degrees (Celsius) and 1 atm is 5% by weight or less, the condensable gas rarely dissolves in the mold releasing layer.

Since the condensable gas rarely dissolves in the mold releasing layer, the amount of the liquefied condensable gas evaporating from the cured film after photocuring of the photocurable composition is decreased. As a result, the surface roughness induced by evaporation of the liquefied condensable gas from the cured film is suppressed and the surface roughness of the cured film is decreased.

The component (C) may be constituted by one mold releasing agent or two or more mold releasing agents.

The blend ratio of the component (C) (in other words, the content of the component (C) in a photocurable composition when the total weight of the photocurable composition is assumed to be 1) relative to the total weight of the photocurable composition of this embodiment is, for example, 0.01% by weight or more and 20% by weight or less, preferably 0.01% by weight or more and 5% by weight or less, more preferably 0.1% by weight or more and 5% by weight or less, and most preferably 0.5% by weight or more and 3% by weight or less. When the blend ratio is 0.01% by weight or more, it becomes easy to separate the mold. When the blend ratio is 20% by weight or less, appropriate surface tension and viscosity may be achieved.

Specific examples of the component (C) are hydrocarbon-based nonionic surfactants represented by formula (3) below.

[Chem. 3]

formula (3)

In formula (3), $R_c$ represents a monovalent hydrocarbon group having 5 or more and 50 or less carbon atoms, $R_a$ represents an alkylene group, m represents an integer of 1 or more, and X represents one selected from an alkoxy group, a hydroxyl group, a carboxyl group, a pyridyl group, a silanol group, and a sulfo group.

The component (C) is preferably a compound represented by formula (3) with $R_c$ representing a monovalent hydrocarbon group having 10 to 30 carbon atoms and more preferably a compound represented by formula (3) with $R_c$ representing a monovalent hydrocarbon group having 10 to 30 carbon atoms and $R_a$ representing an ethylene group. Furthermore, m may represent an integer of 1 or more and 10 or less and X may represent a hydroxyl group.

In particular, the component (C) is most preferably a compound represented by formula (4).

[Chem. 4]

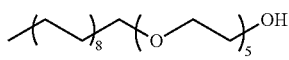
Formula (4)

Hydrocarbon-based nonionic surfactants represented by formulae (3) and (4) are particularly preferable when the condensable gas is 1,1,1,3,3-pentafluoropropane ($CHF_2CH_2CF_3$, HFC-245fa, PFP).

<Other Components>

The photocurable composition according to this embodiment may contain additive components (D) for various purposes in addition to the (meth)acryl monomer (component (A)), the photopolymerization initiator (component (B)), and the mold releasing agent (component (C)) described above as long as the effects of the present invention are not impaired. Examples of the additive components include a sensitizer, a hydrogen donor, an antioxidant, a solvent, and a polymer component. Among these, a sensitizer is preferably contained in the photocurable composition of this embodiment.

A sensitizer is a compound that is added to accelerate polymerization reaction and improve the reaction conversion rate, if needed. An example of the sensitizer is a sensitizing dye.

A sensitizing dye is a compound that is excited upon absorbing light of a particular wavelength and interacts with the photopolymerization initiator (component (B)). The interaction refers to, for example, migration of energy or migration of electrons from the sensitizing dye in an excited state to a photopolymerization initiator (component (B)).

Specific examples of the sensitizing dye include, but are not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

One sensitizer may be used alone or two or more sensitizers may be used in combination.

A hydrogen donor is a compound that reacts with an initiator radical generated from the photopolymerization initiator (component (B)) and with a radical at the polymerization propagating terminal and generates a radical having higher reactivity. A hydrogen donor may be added when the photopolymerization initiator (component (B)) is a photoradical generator.

Examples of the hydrogen donor include, but are not limited to, amine compounds such as N-butylamine, di-n-butylamine, tri-n-butylphosphine, allylthiourea, s-benzyl isothiuronium-p-toluene sulfinate, triethylamine, diethylaminoethyl methacrylate, triethylenetetramine, 4,4'-bis(dialkylamino)benzophenone. N,N-dimethylaminobenzoic acid ethyl ester. N,N-dimethylamino benzoic acid isoamyl ester, pentyl-4-dimethylamino benzoate, triethanolamine, and N-phenylglycine and mercapto compounds such as 2-mercapto-N-phenylbenzimidazole and mercapto propionic acid ester. Among these, 4,4'-bis(dialkylamino)benzophenone and more preferably 4,4'-bis(diethylamino)benzophenone are preferred as the hydrogen donor.

One hydrogen donor may be used alone or a mixture of two or more hydrogen donors may be used.

In the case where the photocurable composition of this embodiment contains a sensitizer or a hydrogen donor as the additive component (D), the amount the additive component (D) relative to the total amount of the polymerizable compound (component (A)) is preferably 0.1% by weight or more and 20% by weight or less, more preferably 0.1% by weight or more and 5.0% by weight or less, and most preferably 0.2% by weight or more and 2.0% by weight or less. At a sensitizer content of 0.1% by weight or more, the effect of accelerating polymerization can be more effectively achieved. When the sensitizer content or the hydrogen donor content is 20% by weight or less, the molecular weight of a polymer compound constituting a photocured product to be produced can be sufficiently increased and dissolution failure and deterioration of storage stability can be suppressed.

<Temperature at the Time of Blending the Photocurable Composition>

In preparing the photocurable composition of this embodiment, at least the component (A), the component (B), and the component (C) are mixed and dissolved at particular temperature conditions. To be specific, preparation may be carried out at a temperature in the range of 0 degrees (Celsius) or higher and 100 degrees (Celsius) or lower.

<Viscosity of Photocurable Composition>

The viscosity of the photocurable composition of this embodiment is preferably 1 cP or more and 100 cP or less, more preferably 5 cP or more and 50 cP or less, and most preferably 6 cP or more and 20 cP or less in terms of the viscosity of a mixture of these components excluding the solvent at 23 degrees (Celsius).

Since the viscosity of the photocurable composition is 100 cP or less, it does not take a long time to fill the recesses of a fine pattern on the mold with the composition in the step of bringing the photocurable composition into contact with the mold described below. Moreover, pattern failures caused by filling failure are reduced.

Since the viscosity is 1 cP or more, in the step of placing the photocurable composition onto the substrate described below, the photocurable composition can be more uniformly placed. Moreover, in the step of bringing the photocurable composition into contact with the mold described below, the photocurable composition rarely flows out from the mold edge.

<Surface Tension of Photocurable Composition>

The surface tension of the photocurable composition of this embodiment at 23 degrees (Celsius) is preferably 5 mN/m or more and 70 mN/m or less, more preferably 7 mN/m or more and 35 mN/m or less, and most preferably 10 mN/m or more and 32 mN/m or less in terms of the surface tension of a mixture of these components excluding the solvent.

Since the surface tension is 5 mN/m or more, in the step of bringing the photocurable composition into contact with a mold described below, it does not take a long time to fill the recesses of the fine pattern on the mold with the composition.

Since the surface tension is 70 mN/m or less, the surface is satisfactorily smooth and flat.

<Impurities in Photocurable Composition>

The photocurable composition may be subjected to a purification step. For example, filtration using a filter or the like may be performed as the purification step.

In conducting filtration with a filter, the component (A), the component (B), the component (C), and optional additive components may be mixed and the resulting mixture may be filtered by using a filter with a pore size of 0.001 micrometer or more and 5.0 micrometers or less. The filtration with a filter may be conducted in multiple stages or repeated a number of times. The filtrate may be filtered again. Examples of the filter used for filtration include, but are not limited to, polyethylene resin filters, polypropylene resin filters, fluorine resin filters, and nylon resin filters.

Performing the purification step removes impurities such as particles in the photocurable composition. As a result, formation of the unintended irregularities in the resulting photocured product obtained by curing the photocurable composition can be reduced and pattern failures can be suppressed.

When the photocurable composition of this embodiment is used in producing a semiconductor integrated circuit, inclusion of metal atom-containing impurities (metal impurities) in the photocurable composition is to be avoided as much as possible in order not to inhibit operation of the product. In such a case, the metal impurity concentration in the photocurable composition is preferably 10 ppm or less and more preferably 100 ppb or less.

Next, a method for producing a patterned film according to an embodiment is described.

FIGS. 1A to 1G are schematic cross-sectional views showing an example of a method for producing a patterned film according to this embodiment.

The method for producing a patterned film according to this embodiment includes the following steps:

(1) a step of placing the photocurable composition of the above-described embodiment on a substrate;

(2) a step of bringing the photocurable composition into contact with a mold in an atmosphere containing a condensable gas;

(3) a step of irradiating the photocurable composition with light; and (4) a step of separating the cured product obtained in the step (3) and the mold from each other.

The method for producing a patterned film according to this embodiment is a process that utilizes a photo imprint technique. However, the method for producing a patterned film according to the present invention is not limited to one that utilizes a photo imprint technique. When the method for producing a patterned film according to the present invention is a process that utilizes a photo imprint technique, a film having a nanometer-order pattern shape can be produced.

A film obtained by the method for producing a patterned film according to this embodiment is preferably a film having a pattern 1 nm or more and 10 mm or less in size and more preferably a film having a pattern 10 nm or more and 100 micrometers or less in size.

These steps will now be described one by one.

<Placement Step (1)>

In this step (placement step), as shown in FIG. 1A, a photocurable composition 1 is placed on a substrate 2 to form a coating film. Since the photocurable composition 1 is a liquid composition, this step is also called a coating step.

The substrate 2 on which the photocurable composition 1 is placed may be appropriately selected according to the usage of a cured product 11 (photocured product) produced by the method of this embodiment.

In particular, if the photocured product 11 is to be used as a mask for processing a substrate, a semiconductor device substrate is used as the substrate 2 shown in FIG. 1A, for example. An example of the semiconductor device substrate is a substrate formed of a silicon wafer. Instead of a substrate formed of a silicon wafer, a substrate composed of aluminum, a titanium-tungsten alloy, an aluminum-silicon alloy, an aluminum-copper-silicon alloy, silicon oxide, silicon nitride, or the like can be used. The semiconductor device substrate used as the substrate 2 may be a substrate formed of the above-described material subjected to a surface treatment such as a silane coupling treatment, a silazane treatment, or treatment for forming a film composed of an organic material, so that the adhesion to the photocurable composition 1 is improved.

A light-transmitting substrate, for example, a transparent substrate such as a glass substrate, can be used as the substrate 2. In this case, the cured product pattern obtained through steps (1) to (4) can be used in an optical member or the like.

Examples of the method for placing the photocurable composition 1 of this embodiment onto the substrate 2 include an ink jet method, a dip coating method, an air knife coating method, a curtain coating method, a wire bar coating method, a gravure coating method, an extrusion coating method, a spin coating method, and a slit scanning method. Note that the thickness of the layer (coating film) that receives the transfer of the shape differs depending on the intended usage but is, for example, 0.01 micrometer or more and 100.0 micrometers or less.

The photocurable composition 1 of this embodiment can be placed on the substrate 2 in two ways, namely, arrangement (1-1) and arrangement (1-2). Of these, the arrangement (1-1) is more preferable. This is because the thickness of the cured film having a pattern shape and the thickness of the residual film of the cured product pattern obtained later can be made more uniform. However, the method for producing a patterned film according to the present invention is not limited to these arrangements.

Arrangement (1-1): The photocurable composition 1 is arranged in two or more portions that are spaced from one another.

Arrangement (1-2): The photocurable composition 1 is arranged on all parts of the surface of the substrate 2.

In the case where the arrangement (1-1) is selected, the size of droplets of the coating film containing the photocurable composition 1 placed (applied) onto the substrate 2 is on the micron order or submicron order. However, this does not limit the scope of the present invention.

In the case where the arrangement (1-2) is selected, the thickness of the coating film containing the photocurable composition 1 placed (applied) onto the substrate 2 differs according to the intended usage. For example, the thickness of the coating film may be adjusted so that the thickness after curing is 1.0 nm or more and 100.0 micrometers or less.

<Step (2) of Bringing the Photocurable Composition into Contact with a Mold in an Atmosphere Containing a Condensable Gas>

The coating film formed of the photocurable composition 1 obtained in the previous step (placement step) is brought into contact with a mold having an original pattern for transferring a pattern shape in an atmosphere containing a condensable gas.

This steps includes steps (2-1) to (2-3) shown in FIG. 1B to FIG. 1C-2.

(2-1) Condensable Gas Supplying Step

First, in this step (condensable gas supplying step), as shown in FIG. 1B, a condensable gas 3 in a gas state is supplied to the ambient atmosphere of the photocurable composition 1 on the substrate 2 at a pressure lower than the vapor pressure or a temperature higher than the boiling point so that the ambient atmosphere of the photocurable composition 1 of this embodiment placed on the substrate 2 contains a condensable gas.

For the purposes of the present invention and the specification, a condensable gas refers to a gas that usually takes a gas form at a temperature and pressure inside the facility for producing a photocured product having a desired pattern but condenses (liquefies) under particular conditions in the contact step (embossing step) (2-2) described below. The details of the particular conditions are described later.

The condensable gas is a gas having a boiling point of –10 degrees (Celsius) or more and 23 degrees (Celsius) or less and a room temperature vapor pressure of 0.1 MPa or more and 0.4 MPa or less. A condensable gas having a boiling point of 10 degrees (Celsius) or more and 23 degrees (Celsius) or less is particularly preferable.

A gas having a room temperature vapor pressure of 0.1 MPa or more and 0.4 MPa or less is easily condensed by capillary pressure generated as the photocurable composition 1 penetrates the gap between the substrate 2 and a mold 4 and the recesses on the mold 4, and liquefies, resulting in elimination of bubbles.

Since the room temperature vapor pressure is 0.4 MPa or more, the effect of eliminating bubbles is high. Since the room temperature vapor pressure is 0.1 MPa or less, there is no need to decrease the pressure and complication of the facility can be avoided.

Note that, typically, an imprint region of an imprint facility of a UV-curable type is used at room temperature. Accordingly, as long as the gas has a boiling point lower than the temperature of the imprint region, the gas can be gasified during imprinting by controlling the temperature. Thus, the structure of the facility can be kept simple. For the purposes of the present invention and the specification, "room temperature" refers to a temperature in the range of 20 degrees (Celsius) or more and 25 degrees (Celsius) or less.

Examples of the condensable gas include fluorocarbons, e.g., chlorofluorocarbon (CFC), fluorocarbon (FC), hydrochlorofluorocarbon (HCFC), hydrofluorocarbon (HFC), and hydrofluoroether (HFE).

Among fluorocarbons, 1,1,1,3,3-pentafluoropropane ($CHF_2CH_2CF_3$, HFC-245fa, PFP) is particularly preferable. PFP has a vapor pressure of 0.14 MPa at 23 degrees (Celsius) which is in the room temperature range and a boiling point of 15 degrees (Celsius).

These condensable gases can be used alone or as a mixture of two or more. The condensable gas may be mixed with a non-condensable gas such as air, nitrogen, carbon dioxide, helium, argon, or the like so as to form a mixed gas.

Among the non-condensable gases, helium is particularly preferable.

Accordingly, a mixed gas containing 1,1,1,3,3-pentafluoropropane and helium is preferable. In order to form such a mixed gas, the flow rate of helium can be set to 2 to 3 assuming that the flow rate of 1,1,1,3,3-pentafluoropropane to be 1.

(2-2) Contact Step

Next, the photocurable composition 1 (layer that receives shape transfer) is brought into contact with the mold 4 (see FIG. 1C-1). This step is also called an embossing step.

The atmosphere surrounding the photocurable composition in the previous step (condensable gas supplying step) is an atmosphere containing the condensable gas 3. Accordingly, the contact step is also conducted in the atmosphere containing the condensable gas 3.

As shown in FIG. 1C-1, when the mold 4 contacts the photocurable composition 1, the photocurable composition 1 penetrates into the gap between the substrate 2 and the mold 4 and recesses of a fine pattern on the surface of the mold 4 by capillary action.

At this time, the condensable gas 3 that is present in the gap between the substrate 2 and the mold 4 and the recesses on the mold 4 is condensed and liquefies under pressure conditions applied to the condensable gas from the photocurable composition 1 penetrating the gap and recesses (in other words, under capillary pressure conditions generated by penetration of the photocurable composition 1), to be more specific, under pressure conditions and other conditions (such as temperature conditions). It should be noted here that a gas that condenses under the above-described conditions is referred to as a "condensable gas" in the present invention and the specification.

The volume of the condensable gas 3 in the gap between the substrate 2 and the mold 4 and the recesses on the mold 4 is significantly reduced and becomes close to zero as it liquefies. Accordingly, bubbles rarely occur in a fine pattern 10 of the coating film composed of the photocurable composition 1. This improves the pattern transfer accuracy. FIG.

2 is a plan view of a photocurable composition 1 placed on a plurality of portions spaced from one another (arrangement (1-1)) in step (1).

FIG. 2A is a diagram showing the state of the photocurable composition 1 in the placement step (1) and FIG. 2B is a diagram showing the state of the photocurable composition 1 in the contact step (2).

When three droplets of the photocurable composition 1 are arranged to be spaced from one another as shown in FIG. 2A and brought into contact with a mold (not shown in the drawing), the droplets move and diffuse. Two droplets that have diffused and come to form a thin film contact each other at a site 1a. Three droplets that have diffused and come to form a thin film contact one another at a site 1b. The condensable gas that is present at the site 1a and the site 1b is pressured by the photocurable composition 1. As a result, the condensable gas condenses and liquefies. Accordingly, bubbles rarely form at the site 1a and the site 1b.

The mold 4 used in this step needs to be composed of a light-transmitting material because of the next step (irradiation step).

Examples of the material for the mold 4 include glass, quartz, PMMA, light-transmitting resins such as polycarbonate resin, a transparent metal vapor-deposited film, a flexible film such as a polydimethylsiloxane film, a photo-cured film, and a metal film. However, in the case where a light-transmitting resin is used as the material for the mold 4, that light-transmitting resin needs to be insoluble in the solvent contained in the photocurable composition 1.

The mold 4 may be subjected to a surface treatment prior to this step of bringing the photocurable composition into contact with the mold in order to improve the separation property between the cured product and the surface of the mold 4. An example of the surface treatment is a method of preliminarily forming a releasing layer on the mold surface by applying a mold releasing agent to the surface of the mold. Examples of the mold releasing agent to be applied to the surface of the mold include silicon releasing agents, fluorine releasing agents, polyethylene releasing agents, polypropylene releasing agents, paraffin releasing agents, montan releasing agents, and carnauba releasing agents. For example, a commercially available application-type releasing agent such as OPTOOL DSX produced by Daikin Industries Ltd., is suitable for use. These releasing agents may be used alone or in combination. Among these, fluorine releasing agents are particularly preferable.

The pressure at the time the mold 4 is contacted to the photocurable composition 1 is not particularly limited. The contact time is also not particularly limited. However, when the contact time is short, the photocurable composition 1 may not sufficiently penetrate the gap between the substrate 2 and the mold 4 and the recesses (fine pattern) on the mold 4. When the contact time is long, the productivity may be degraded.

<Irradiation Step (3)>

Next, as shown in FIG. 1D, the contact portion between the photocurable composition 1 and the mold 4, in particular, the fine pattern 10 (FIG. 1C-2) of a coating film containing the photocurable composition 1 and filling the fine pattern of the mold 4, is irradiated with light through the mold 4. As a result, the fine pattern 10 of the coating film filling the fine pattern of the mold 4 is cured by irradiation with light and forms a cured product 11.

The light applied to the photocurable composition 1 constituting the fine pattern 10 of the coating film filling the fine pattern of the mold 4 is selected in accordance with the sensitive wavelength of the photocurable composition 1. In particular, UV light having a wavelength of about 150 nm to 400 nm, an X ray, an electron beam, of the like may be appropriately selected.

Among these, UV light is particularly preferable as the light (light 5) applied to the fine pattern 10 of the coating film. This is because most curing aids (photopolymerization initiators) that are commercially available are compounds sensitive to UV light. Examples of the light source that can emit ultraviolet light include a high pressure mercury lamp, an ultra high pressure mercury lamp, a low pressure mercury lamp, a deep-UV lamp, a carbon arc lamp, a chemical lamp, a metal halide lamp, a xenon lamp, a KrF excimer laser, an ArF excimer laser, and a $F_2$ excimer laser. Among these, an ultra high pressure mercury lamp is particularly preferable. The number of light sources to be used may be one or any number more than 1. Irradiation may be performed on all or some parts of the coating film filling the fine pattern of the mold 4.

Irradiation may be performed intermittently two or more times or continuously on all parts. Alternatively, a region A may be irradiated in a first irradiation process and then a region B different from the region A may be irradiated in a second irradiation process. The first and second irradiation processes may be repeated.

In the case where the photocurable composition 1 is also thermally curable, a thermal curing process may be conducted at the same time as or after the light irradiation, and before the mold releasing step. In performing thermal curing, the heating atmosphere, heating temperature, and the like are not particularly limited. For example, heating may be performed in an inert atmosphere or at a reduced pressure at a temperature of 40 degrees (Celsius) or more and 200 degrees (Celsius) or less. Heating can be performed by using a hot plate, an oven, or a furnace, for example.

<Mold Releasing Step (4)>

Next, the photocured product 11 and the mold 4 are separated from each other. As a result, a cured film 12 having a particular pattern shape is formed on the substrate 2.

In this step (mold releasing step), as shown in FIG. 1E, the cured product 1 is separated from the mold 4. The cured film 12 obtained thereby carries a pattern that is an inversion of the fine pattern formed on the surface of the mold 4 in the step (3) (light irradiation step).

The method for separating the cured product 11 from the mold 4 is not particularly limited as long as the cured product 11 is not impaired by separation. No limitations are imposed on the conditions thereof. For example, the substrate 2 (working substrate) may be fixed and the mold 4 may be moved away from the substrate 2 to conduct separation. The mold 4 may be fixed and the substrate 2 may be moved away from the mold 4 to conduct separation. The mold 4 and the substrate 2 may be moved in opposite directions to conduct separation.

A cured film 12 having a desired recess/protrusion pattern shape (the pattern shape derived from the recesses and protrusions on the mold 4) can be obtained by the production process that includes steps (1) to (4) above. The pattern pitches of the recess/protrusion pattern of the cured film 12 are determined by the pattern pitches of the recess/protrusion pattern on the surface of the mold 4.

The pattern pitches of the recess/protrusion pattern on the surface of the mold 4 can be freely set. In particular, the pattern pitch may be at the millimeter scale, the micron scale, the submicron scale, or the nanometer scale. If the production method of the present invention is used to form a nanometer-scale recess/protrusion pattern, a pattern having a pattern pitch of 20 nm or less can be formed.

A mold 4 having a smaller size than the substrate 2 may be used. In this case, some part of the photocurable composition 1 on the substrate 2 does not come into contact with the mold 4. In such a case, the mold 4 can be moved as needed so that the production process that includes the steps (1) to (4) described above can be performed on two or more regions on the substrate 2. As a result, a plurality of cured films 12 having a patterned shape derived from the recess/protrusion shape of the mold 4 can be obtained. The resulting patterned cured film 12 can be used as an optical member (or a part of an optical member) such as a Fresnel lens or a diffraction lattice, for example. In such a case, an optical member that includes at least a substrate 2 and a patterned cured film 12 on the substrate 2 can be obtained.

<Etching Step (5)>

The cured film obtained by the mold releasing step (4) has a particular pattern shape but some film may remain in the region other than the region where the pattern shape is formed (hereinafter, this remaining film may be referred to as "residual film"). In such a case, as shown in FIG. 1F, the cured film (residual film) in the region to be removed from the patterned cured film is removed. As a result, a cured product pattern 13 having a desired recess/protrusion shape (pattern shape derived from the recess/protrusion shape of the mold 4) can be obtained.

An example of the method for removing the residual film is to remove the film (residual film) at the recesses of the patterned cured film 12 by etching or the like so as to expose the surface of the substrate 2 at the recesses of the pattern of the cured film 12.

The specific method for etching away the film at the recesses of the pattern of the patterned cured film 12 is not particularly limited. Any known method, such as dry etching, can be employed. A known dry etching machine may be employed in dry etching. The source gas for dry etching is appropriately selected in accordance with the element composition of the cured film, which is the film to be etched. Examples of the source gas include halogen gases such as $CF_4$, $C_2F_6$, $C_3F_8$, $CCl_2F_2$, $CCl_4$, $CBrF_3$, $BCl_3$, $PCl_3$, $SF_6$, and $Cl_2$, oxygen-containing gases such as $O_2$, CO, and $CO_2$, inert gases such as He, $N_2$, and Ar, and $H_2$ and $NH_3$. These gases may be used in combination as a mixture.

A cured pattern 13 having a desirable recess/protrusion pattern shape (pattern shape derived from the recesses and protrusions of the mold 4) can be obtained by the production process including the steps (1) to (5) described above. An article having the cured pattern can also be obtained. In the case where the cured pattern 13 is used to process the substrate 2, a substrate processing step (step (6)) below is performed.

The cured pattern 13 may be used as an optical part (or a portion of an optical part) such as a diffraction lattice or a polarizing plate so as to obtain an optical component. In such a case, the optical component may include at least a substrate 2 and a cured pattern 13 on the substrate 2.

<Substrate Processing Step (6)>

The cured pattern 13 having a recess/protrusion pattern shape obtained by the method for producing a patterned film according to this embodiment can be used as a film for an interlayer insulating film included in an electronic component such as a semiconductor device, e.g., an LSI, a system LSI, a DRAM, an SDRAM, a RDRAM, or a D-RDRAM. The cured pattern 13 can also be used as a resist film in the process of producing a semiconductor device.

In the case where the cured pattern 13 is used as a resist film, the portions of the substrates in which the surface has been exposed by the etching step (5) are etched or ion-implanted. During this step, the cured pattern 13 serves as a mask. As a result, a circuit board that is constituted by a substrate 2 and a circuit structure 20 (FIG. 1G) based on the pattern shape of the cured pattern 13 and that can be used in semiconductor devices and the like can be obtained. Electronic parts may be disposed on this circuit board so as to form an electronic component (electronic device). A controlling mechanism for controlling the circuit board may be provided to the circuit board so as to form an electronic component such as a display, a camera, or medical equipment. Similarly, the cured pattern 13 may be used as a resist film and an optical component may be obtained by performing etching or ion implantation. In producing a substrate having a substrate or an electronic component, the cured pattern 13 may be ultimately removed from the processed substrate or may remain as a part that constitutes a device.

EXAMPLES

The present invention will now be described in further detail by way of Examples which do not limit the technical scope of the present invention. Note that the "parts" and "%" used below is on a weight basis unless otherwise noted.

Example 1

<Measurement of Saturated Solubility of Mold Releasing Agent (Component (C)) in Condensable Gas>

The saturated solubility of BLAUNON SR-705 (produced by Aoki Oil Industrial Co., Ltd.), which is a hydrocarbon-based nonionic surfactant serving as the mold releasing agent (component (C)), in PFP liquid at 5 degrees (Celsius) and 1 atm was measured.

Into a sample jar, 0.10 g of BLAUNON SR-705 was weighed and 10.0 g of PFP in a liquid state at 5 degrees (Celsius) was added thereto. BLAUNON SR-705 did not dissolve. The saturated solubility of BLAUNON SR-705 (component (C)) in PFP was thus less than 1% by weight.

<Measurement of Saturated Solubility of Condensable Gas in (Meth)Acrylate Monomer (Component (A))>

1,1,1,3,3-Pentafluoropropane ($CHF_2CH_2CF_3$, HFC-245fa, PFP) was used as the condensable gas. The room-temperature (23 degrees (Celsius)) saturated solubility of PFP in a (meth)acrylate monomer (component (A)), which was a mixed solution containing 75 parts by weight of isobornyl acrylate (produced by Kyoeisha Chemical Co., Ltd., trade name: IB-XA) and 25 parts by weight of 1,10-decanediol diacrylate (produced by Shin-Nakamura Chemical Co., Ltd., trade name: A-DOD-N), was measured.

Three grams of the (meth)acrylate monomer (component (A)) was weighed and PFP was bubbled into the (meth)acrylate monomer at a flow rate of 0.1 L/min for 15 minutes at 23 degrees (Celsius) and 1 atm. The total weight measured was 3.87 g. Thus, the saturated solubility of PFP (condensable gas) in the (meth)acrylate monomer (component (A)) was 29% by weight.

<Preparation of Photocurable Composition (a-1)>

A (meth)acrylate monomer (component (A)), a photopolymerization initiator (component (B)), and a mold releasing agent (component (C)) described below were mixed to obtain a mixed solution.

Component (A) (total: 100 parts by weight)

(A-1) Isobornyl acrylate (produced by Kyoeisha Chemical Co., Ltd., trade name: IB-XA): 75 parts by weight (A-2) 1,10-Decanediol diacrylate (produced by Shin-Nakamura Chemical Co., Ltd., trade name: A-DOD-N): 25 parts by weight Component (B)

(B-1) Lucirin TPO (produced by BASF): 3 parts by weight

Note that (B-1) Lucirin TPO is a compound represented by formula (2) below.

[Chem. 5]

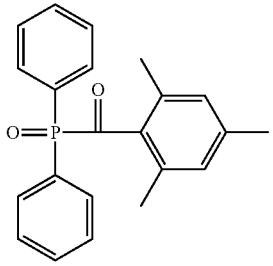

Formula (2)

Component (C)

(C-1) BLAUNON SR-705 (produced by Aoki Oil Industrial Co., Ltd.): 0.5 part by weight Note that (C-1) BLAUNON SR-705 is a compound represented by formula (4) below.

[Chem. 6]

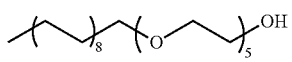

Formula (4)

Component (D)

(D-1) 4,4-Bis(diethylamino)benzophenone: 0.5 part by weight

Note that (D-1) 4,4-bis(diethylamino)benzophenone is a compound represented by formula (5).

[Chem. 7]

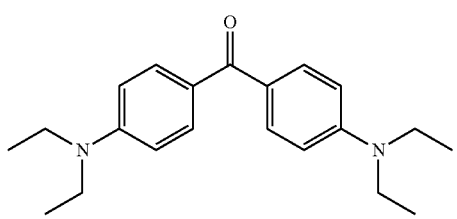

Formula (5)

Next, the mixed solution obtained was filtered through an ultrahigh-molecular-weight polyethylene filter with 5 nm pore size. As a result, a photocurable composition (a-1) of this example (Example 1) was obtained.

<Evaluation of Surface Roughness of Nano-Imprint Pattern of Photocurable Composition (a-1)>

A nano-imprint pattern of the photocurable composition (a-1) was formed by the method described below. The surface roughness of the nano-imprint pattern was evaluated by using an atomic force microscope.

(1) Placement Step

A total of 1440 droplets of the photocurable composition (a-1) (11 pL per droplet) were dropped by an ink jet method onto a 300 mm silicon wafer on which an adhesion promoting layer having a thickness of 3 nm was formed as an adhesive layer. The droplets were dropped in a region 26 mm in length and 33 mm in width in such a manner that the pitches between the droplets were substantially even.

(2) Mold Contact Step and Irradiation Step

Next, the ratio of the flow rate of PFP to the flow rate of He was adjusted to 1:3 so that the atmosphere was constituted by a mixture of PFP and He. A quartz mold (26 mm in length and 33 mm in width) not subjected to a surface treatment and having a 28 nm line-and-space (US) pattern was brought into contact with the photocurable composition (a-1) on the silicon wafer.

Thirty seconds after the quartz mold was brought into contact with the photocurable composition, the photocurable composition was irradiated with UV light through the quartz mold by using a UV light source (EXECURE 3000 produced by HOYA CANDEO OPTRONICS CORPORATION) equipped with a 200 W mercury xenon lamp. In irradiating the photocurable composition with UV light, an interference filter (VPF-50C-10-25-31300, produced by Sigma Koki Co., Ltd.) that selectively passes light of 313 plus/minus 5 nm wavelength was placed between the UV light source and the quartz mold. The illuminance of the UV light was 60 mW/cm$^2$ directly under the quartz mold at a wavelength of 313 nm. The UV irradiation was conducted for 5 seconds (exposure: 300 mJ/cm$^2$) under the above-described conditions.

(3) Mold Releasing Step

The quartz mold was pulled up at a rate of 0.5 mm/s to separate the mold from the photocured film.

(4) Evaluation of Surface Roughness of Nano-Imprint Pattern

The surface roughness PV (peak-to-valley) value of the photocured film after separation from the mold was measured with Nanoscope which is an atomic force microscope produced by Veeco Instruments Inc. (measured range: 2 micrometers×2 micrometers).

The PV value was 15 nm.

Comparative Example 1

Measurement of Saturated Solubility of Mold Releasing Agent (Component (C)) in Condensable Gas The saturated solubility of pentadecaethylene glycol mono-1H,1H,2H,2H-perfluorooctyl ether (F(CF$_2$)$_6$CH$_2$CH$_2$(OCH$_2$CH$_2$)$_{15}$OH or Megaface EXP. TF-2067 produced by DIC Corporation) represented by formula (6) at 5 degrees (Celsius) in a condensable gas, PFP, liquid at 5 degrees (Celsius) and 1 atm was measured.

[Chem. 8]

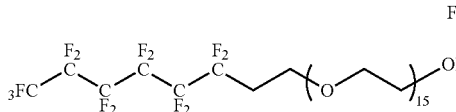

Formula (6)

Into a sample jar, 1.00 g of Megaface EXP. TF-2067 was weighed and 0.48 g of PFP liquid at 5 degrees (Celsius) and 1 am was added thereto. Megaface EXP. TF-2067 did not dissolve. PFP was further added thereto so that the total amount of PFP was 0.62 g. As a result, Megaface EXP. TF-2067 dissolved completely. Accordingly, the saturated solubility of the Megaface EXP. TF-2067 (mold releasing agent (component (C)) in PFP (condensable gas) was 62% by weight or more and less than 68% by weight.

<Preparation of Photocurable Composition (b-2)>

A photocurable composition (b-2) was prepared as in Example 1 except that BLAUNON SR-705 (C-1) was not added and 1.1 parts by weight of Megaface EXP. TF-2067, a fluorine-based surfactant, was added.

<Evaluation of Surface Roughness of Photocured Film of Photocurable Composition (b-2)>

The surface of the photocured film prepared by using the photocurable composition (b-2) was prepared as in Example 1. The PV value was 25 nm.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-133539, filed Jun. 26, 2013, Japanese Patent Application No. 2013-247134, filed Nov. 29, 2013, and Japanese Patent Application No. 2014-109338, filed May 27, 2014 which are hereby incorporated by reference herein in their entirety.

The invention claimed is:

1. A method for producing a patterned film, the method comprising:
a step of placing a photocurable composition on a substrate; a step of bringing the photocurable composition into contact with a mold in an atmosphere containing a 1,1,1,3.3-pentafluoropropane condensable gas, the mold having an original pattern for transferring a pattern shape;
a step of irradiating the photocurable composition with light to form a cured film; and
a step of separating the cured film and the mold from each other, wherein the photocurable composition is a photocurable composition used for performing imprint in an atmosphere containing a condensable gas, the photocurable composition comprising:
a component (A) which is a (meth)acrylate monomer; a component (B) which is a photopolymerization initiator; and a component (C) which is a mold releasing agent, wherein a saturated solubility of the component (C) in the condensable gas at 5 degrees (Celsius) and 1 atm is 5% by weight or less, the condensable gas being in a liquid state at 5 degrees (Celsius) and 1 atm.

2. The method according to claim 1, wherein the condensable gas is a gas that condenses and liquefies under pressure generated in the step of bringing the photocurable composition into contact with a mold as the photocurable composition penetrates a gap between the substrate and the mold and recesses in a fine pattern on a surface of the mold.

3. The method according to claim 1, wherein a surface of the original pattern of the mold is composed of quartz.

4. The method according to claim 1, wherein the atmosphere containing the condensable gas is a mixed gas containing the condensable gas and a non-condensable gas.

5. The method according to claim 4, wherein the non-condensable gas is helium.

* * * * *